United States Patent [19]
Oeffinger et al.

[11] 4,056,813
[45] Nov. 1, 1977

[54] PASSIVE CHEVRON REPLICATOR

[75] Inventors: Thomas R. Oeffinger, Placentia; Leonard R. Tocci, Laguna Niguel, both of Calif.

[73] Assignee: Rockwell International Corporation, El Segundo, Calif.

[21] Appl. No.: 623,681

[22] Filed: Oct. 20, 1975

[51] Int. Cl.² ............................................. G11C 11/02
[52] U.S. Cl. ........................................ 365/12; 365/43
[58] Field of Search ................... 340/174 BG, 174 TF

[56] References Cited
U.S. PATENT DOCUMENTS

| 3,727,197 | 4/1973 | Chang | 340/174 BG |
| 3,810,133 | 5/1974 | Bobeck | 340/174 BG |
| 3,832,701 | 8/1974 | Bobeck | 340/174 TF |
| 3,868,661 | 2/1975 | Bonyhard | 340/174 BG |

Primary Examiner—Thomas B. Habecker
Attorney, Agent, or Firm—L. Lee Humphries; H. Fredrick Hamann; G. Donald Weber, Jr.

[57] ABSTRACT

There is described a passive replicator device to be used in magnetic bubble domain systems. The replicator is passive, i.e., does not require an active element such as a current source or the like, and both propagates and replicates bubble domains. In a preferred embodiment, the replicator uses chevron type elements arranged in an appropriate pattern so as to interact with a pair of propagation paths wherein bubble domains are propagated. A bubble in one propagation path is routinely transferred therealong and, concurrently, replicated by the instant device into another propagation path. A plurality of elements arranged in juxtaposition to the chevrons assists in controlling the propagation of the bubbles through the respective propagation paths and, at the appropriate time, provides a cutting action wherein a bubble which is elongated between the chevrons of the two propagation paths is split into two separate bubbles.

12 Claims, 2 Drawing Figures

PASSIVE CHEVRON REPLICATOR

The invention described herein was made in the performance of work under NASA Contract No. NASI-12981 and is subject to the provision of Section 305 of the National Aeronautics and Space Act of 1958 (72 Stat. 435; 42 USC 2457).

BACKGROUND OF THE INVENTION

1. Field of the Invention

This invention is related to magnetic bubble domain devices and in particular is related to switching devices wherein magnetic bubble domains are replicated (i.e., reproduced) in a passive manner.

2. Description of Prior Art

With the advent of magnetic bubble domain devices and systems utilizing such devices, various and sundry individual elements for performing various logic and/or other operational functions have been developed. One of the devices that has been developed is a so-called replicator switch. In the replicator switch a bubble is typically propagated along a first propagation path. The bubble is acted upon in such a manner that the bubble is split into two separate bubbles, one of which continues along the original path and the other one of which traverses a new propagation path. However, many of these replicator switches have the disadvantage that a current conductor is required to sever the bubble into the two separate bubbles. This disadvantage is important insofar as power requirements, number of leads to the device, geometry and total area of the system are concerned.

SUMMARY OF THE INVENTION

The invention comprises a passive replicator having at least two columns of chevrons oppositely directed and offset from each other. At least one forming element which is substantially parallel to one column of chevrons and extends into juxtaposition to the other column of chevrons. An additional forming element can be utilized in conjunction with the first mentioned forming element to assure proper operation of the replicator. Each of the chevron columns can be associated with a separate propagation path for bubble domains.

BRIEF DESCRIPTION OF THE PREFERRED EMBODIMENT

Figure 1:
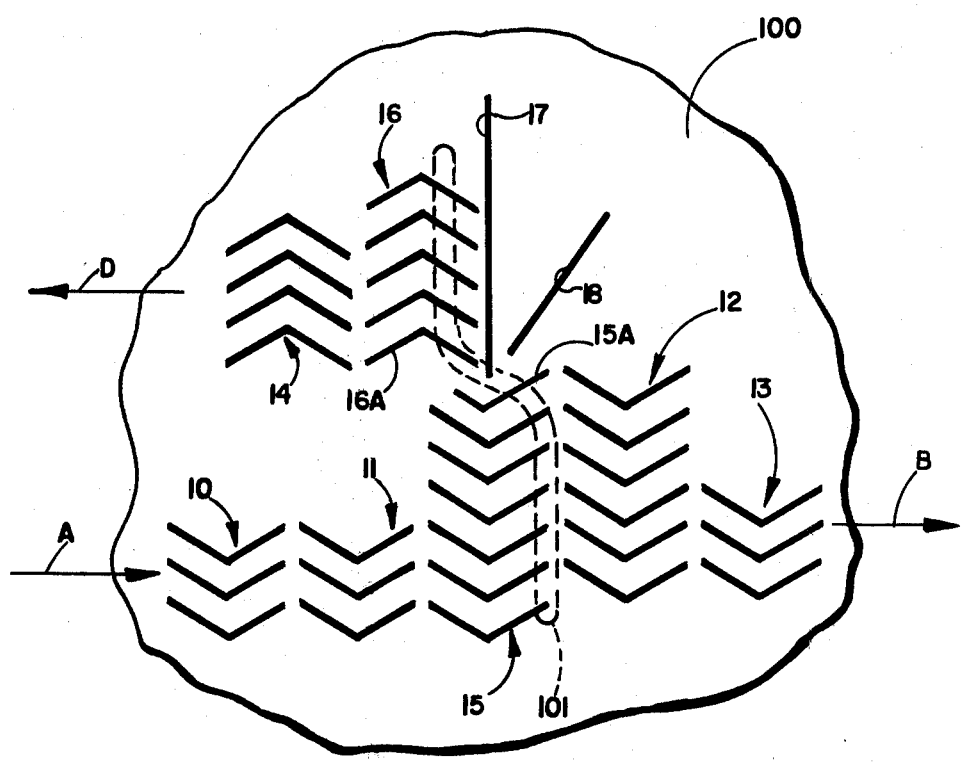
FIG. 1 is a schematic representation of a bubble domain device arrangement which forms the passive replicator of the instant invention.

Referring to FIG. 1, it is seen that a pair of propagation paths are suggested. The first propagation path (indicated by arrows A and B) may be considered to form a portion of a storage area or a portion of a propagation path associated with the stoargae area or the like. Typically, this propagation path is the main path through which a bubble is propagated. This propagation path includes chevron columns 10, 11, 12 and 13 as well as any suitable number of additional chevron columns.

The other propagation path (indicated by arrow D) may be considered to be a propagation path wherein the bubble is propagated to a detector, to a guardrail or to another bubble domain device of any type. The further utilization of the bubbles after passing through the replicator/transfer switch is, essentially immaterial to the invention. The second propagation path is represented by chevron column 14.

The replicator switch is represented by chevron columns 15 and 16 as well as forming elements or pusher bars 17 and 18. It is noted that chevron columns 15 and 16 are relatively elongated with respect to the chevron columns in the remainder of the propagation paths. The precise number of chevrons in columns 15 and 16 is a function of the type of material used to support the bubble domains, the mobility characteristic thereof and various other operating parameters which are known in the art. As different materials are utilized along with different operating parameters and systems, the number of chevrons required in columns 15 and 16 will vary with design.

However, it is noted that chevron columns 15 and 16 are oppositely directed, i.e., the apices of the chevrons in the respective columns are pointed in generally opposite directions. Of course, it is possible that the apices can be arranged in other than completely opposite directions. In addition, it is noted that the chevron columns 15 and 16 are offset relative to each other. In the preferred embodiment, the ends of one of the chevrons, in this example chevron column 16, are substantially aligned with the apices of the chevrons in the other chevron column, i.e., column 15.

The main pusher bar 17 is located adjacent the ends of the chevrons in column 16 and is aligned substantially continuously with the projected line of the apices of the chevrons in column 15. One end of the pusher bar 17 is positioned relatively close to the apex of the last chevron in column 15. The other end of pusher bar 17 extends beyond the extent of column 16.

In a preferred embodiment having improved operating characteristics, chevron 15A, i.e., the chevron adjacent to one end of pusher bar 17 and to the end chevron in column 16, has a foreshortened leg as described hereinafter. In addition, pusher bar 18 is disposed at an angle to pusher bar 17 on the side opposite from chevron column 16. One end of pusher bar 18 is disposed adjacent to that end of pusher bar 17 which is positioned adjacent to column 15. However, the end of pusher bar 18 is removed somewhat from chevron 15A of chevron column 15 wherein the effect thereof is somewhat less significant than pusher bar 17.

Figure 2:
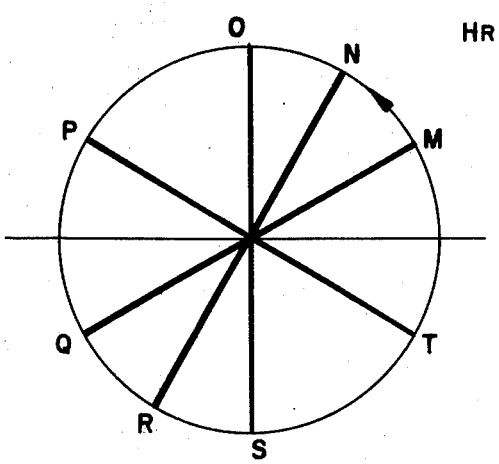
FIG. 2 is a graphic representation of the rotating, in-plane magnetic field applied to the arrangement shown in FIG. 1.

Describing the operation of the device, concurrent reference is made to FIGS. 1 and 2. Initially, it is assumed that no bubbles are present in the system. A bubble from a storage area or the like is applied to the first propagation path in the direction indicated by the arrow A. The bubble propagates through chevron columns 10 and 11 in the usual manner. In addition, the bubble will propagate through chevron columns 15, 12 and 13 in the usual manner with the additional feature that the bubble is expanded as it passes through column 15. Thus, a standard transfer operation occurs. As a result, the replicator switch of this invention operates as a propagation device as well and as a replicator switch.

In order to understand the replicate action of the switch, it is assumed that a bubble has been transferred to column 15 in the normal manner. The bubble is expanded along the leftmost edge of the chevrons of column 15. This operation occurs when the rotating magnetic field $H_R$ is in position P as shown in FIG. 2. As $H_R$ rotates, magnetic poles are formed in the various structural devices shown in FIG. 1 in the normal manner. However, assuming that no other bubble exists, no action is observed until field $H_R$ reaches the position S shown in FIG. 2. At that time, a relatively strong pole is formed at the bottom of pusher bar 17 wherein the bubble expands to include this pole.

At time T, the attractive pole of column 15 has moved slightly away from the apices of the chevrons. Typically, the poles in column 16 are sufficiently stong to cause the bubble in column 15 and pusher bar 17 to be stripped out and expanded along the apices (or even the right ends) of column 15 and the right ends of the chevrons of column 16.

As field $H_R$ continues to rotate, it reaches the position M (see FIG. 2) wherein a strong pole is achieved at the right ends of the chevrons of column 15 and a relatively weak pole is achieved at the apices of column 16. Consequently, the bubble takes the configuration suggested in dashed outline 101.

As the field $H_R$ continues to rotate and achieves the position N (FIG. 2) a strong negative pole is achieved at the bottom end of pusher bar 18. This negative pole has the effect of generally repelling bubble 101 which is stretched between columns 15 and 16. This pole, while relatively strong, because of the geometry involved merely repels the bubble wherein the bubble remains substantially between chevron 15A of column 15 and the lower end of pusher bar 17.

As field $H_R$ reaches position O, a strong negative pole is produced at the lower end of pusher bar 17. This strong pole is in the immediate vicinity of bubble 101 and has the effect of repelling bubble 101 to such an extent that the bubble is actually severed in the region between chevron columns 15 and 16 and pusher bar 17. The bottom portion of the severed bubble tends to remain substantially at the right ends of chevron column 15 (a pole is produced by $H_R$ in the N position). The upper portion of the bubble tends to move toward the apices of chevron column 16 (a pole is produced there also by $H_R$ in the N position). As field $H_R$ rotates to position O, the upper bubble is more strongly urged to the apices of the chevrons of column 16. Thereafter, the bubbles in chevron columns 16 and 15 propagate along the respective propagation paths in response to field $H_R$. In this instance, the bubbles propagate in opposite directions under the influence of rotating field $H_R$.

Thus, it is seen that there has been shown and described a simplified, passive replicator/transfer device. This device is relatively simple in construction, requires no current pulse or signal to establish bubble propagation and/or replication, permits bubbles to be propagated in opposite directions with a minimum transition device structure and in a minimum operating cycle time. Of course, it is apparent to those skilled in the art that minor adjustments may be made to the placement of respective elements and in the design of some of the elements. The design or placement of these elements may improve efficiency or other operating parameters in a particular mode of operation or circuit design. The illustrated embodiment is intended to be illustrative only and is not intended to be limitative of the invention. Any modification or change which occurs to those skilled in the art and which falls within the purview of the inventive concept is intended to be included in this description as well. The scope of the invention is limited only in accordance with the claims appended hereto.

Having thus described the invention, what is claimed is:

1. A magnetic bubble domain device comprising
   means for establishing a magnetic bubble domain,
   a first pattern of magnetizable means for propagating a magnetic bubble domain in response to an applied magnetic field,
   a second pattern of magnetizable means for propagating a magnetic bubble domain in response to said applied magnetic field,
   said first and second patterns lying in an overlapping offset relation to each other, and
   at least one elongated magnetizable element arranged in a side-by-side relationship with said second pattern and in an end-to-end relationship with said first pattern in order to selectively interpose a magnetic pole between said first and second patterns, which pole first attracts and then repels a magnetic bubble domain propagating through said first and second patterns such that said magnetic bubble domain is divided into two separate magnetic bubble domains.

2. A device recited in claim 1 wherein each of said first and second patterns of magnetizable means comprises a column having a plurality of chevrons,
   said overlapping offset relation of said first and second patterns defined by having the ends of one column of chevrons substantially colinear with the apices of the other column of chevrons.

3. The device recited in claim 2 wherein each of said columns of chevrons is oppositely directed relative to each other.

4. The device recited in claim 3 wherein said oppositely directed chevrons have the apices pointing away from each other.

5. The device recited in claim 2 wherein at least one of the chevrons in one of the columns adjacent to the other column has one arm portion shorter than the other arm portion.

6. The device recited in claim 1 wherein said at least one elongated magnetizable element comprises an elongated strip device which is longer than said second pattern of magnetizable means which is arranged side-yy-side therewith.

7. The device recited in claim 1 including
   a second elongated magnetizable element which is arranged at an angle relative to said at least one elongated magnetizable element and has one end thereof adjacent to the end of said at least one elongated magnetizable element which is disposed adjacent to said first pattern of magnetizable means.

8. The magnetic bubble domain device recited in claim 1 wherein,
   said means for establishing a magnetic bubble domain comprises,
   a layer of material which supports magnetic bubble domains therein,
   and
   field means for supplying magnetic fields to said layer of material.

9. The magnetic bubble domain device recited in claim 8 wherein,
   said first and second patterns of magnetizable means and said elongated magnetizable element are all supported by a common surface of said layer of material.

10. A passive replicator for magnetic bubble domains comprising,
    a first column of magnetizable chevron elements associated with a first propagation path, a second column of magnetizable chevron elements associated with a second propagation path, said first and second columns of magnetizable chevron elements arranged in an overlapping array such that the ends of the chevrons in said first column are aligned approximately with the apices of the chevrons in said second columns, and an elongated magnetizable bar element arranged to be substantially parallel to said first column of magnetizable chevron elements and aligned with the apices of the chevrons in said second column so as to selectively provide an attracting pole and repelling pole at the end thereof to split a magnetic bubble domain stretched between said first and second columns of magnetizable chevron elements.

11. The passive replicator recited in claim 10 wherein said first propagation path is comprised of a plurality of columns of chevrons, said second propagation path is comprised of a further plurality of columns of chevrons.

12. The passive replicator recited in claim 10 wherein said first column of magnetizable chevron elements expands a magnetic bubble domain in a direction transverse to said first propagation path.

* * * * *